(12) United States Patent
Itabashi

(10) Patent No.: US 6,370,768 B1
(45) Date of Patent: Apr. 16, 2002

(54) CIRCUIT BOARD, A METHOD FOR MANUFACTURING SAME, AND A METHOD OF ELECTROLESS PLATING

(75) Inventor: Takeyuki Itabashi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/116,253

(22) Filed: Jul. 16, 1998

(30) Foreign Application Priority Data

Jul. 28, 1997 (JP) .............................................. 9-201399
Jul. 28, 1997 (JP) .............................................. 9-201408

(51) Int. Cl.$^7$ ................................................. A01K 3/10
(52) U.S. Cl. .............................. 29/852; 29/846; 427/97; 205/126; 205/157; 205/187
(58) Field of Search ...................... 29/852, 846; 427/97; 205/126, 157, 187

(56) References Cited

U.S. PATENT DOCUMENTS

| 4,456,506 A | * | 6/1984 | Stein et al. ..................... 204/15 |
| 5,116,463 A | * | 5/1992 | Lin et al. ..................... 156/643 |
| 5,188,723 A | * | 2/1993 | Yu et al. ..................... 205/125 |
| 5,660,706 A | * | 8/1997 | Zhao et al. ................... 205/123 |
| 5,800,858 A | * | 9/1998 | Bickford et al. ............... 427/97 |
| 5,874,154 A | * | 2/1999 | Bickford et al. ............. 428/131 |

FOREIGN PATENT DOCUMENTS

GB    2070647    9/1981

OTHER PUBLICATIONS

Patent Abstracts of Japan, Publication No. 05335713, Published Dec. 17, 1993.

* cited by examiner

*Primary Examiner*—Carl J. Arbes
(74) *Attorney, Agent, or Firm*—Antonelli, Terry, Stout & Kraus,, LLP

(57) ABSTRACT

A circuit board is provided, wherein electroless plating to fill via-holes can be controlled uniformly with desirable reproducibility, and via-hole portions can be identified from the surface of the substrate after forming a second conductor thereon. The specific circuit board is obtained by applying a potential higher then the potential of the electroless plating to the conductor on the surface when filling the via-holes by electroless plating. In the circuit board, via-hole portions can be identified optically, because the via-hole portion differs from the second conductor in surface condition, such as when a dent is formed.

22 Claims, 8 Drawing Sheets

CIRCUIT BOARD, A METHOD FOR MANUFACTURING SAME, AND A METHOD OF ELECTROLESS PLATING

BACKGROUND OF THE INVENTION

The present invention relates to a novel circuit board, whereon semiconductors and the like are mounted, and a method of manufacturing the same; and more particularly, the invention relates to a circuit board having via-holes filled with metal for connecting interlayer conductor wiring, and a method of manufacturing the same.

The technology to fill holes, which are formed in an insulator, with metal is applied to the technology for interlayer connection of high density circuit boards, such as a LSI, a thin film multilayered board, a build up board, and the like. For the interlayer connection of an LSI, wet metallizing methods, such as plating and the like, are not used, but dry metallizing such as spattering, CVD (chemical vapor deposition method), and the like are used. For instance, a method of filling aluminum into via-holes by the spattering method is disclosed in JP-A-6-168907 (1994). A method of filling tungsten into contact holes by a monosilan reduction CVD method of tungsten fluoride, or hydrogen reduction CVD method is disclosed in JP-A-8-31932 (1996). Furthermore, a method of forming a connecting plug of copper by a CVD method using an organo copper compound as a raw material is disclosed in JP-A-6-236879 (1994).

However, since all these methods are dry metallization methods and methods for processing which use an apparatus provided with a vacuum system, these methods have problems, such as a high equipment cost and a low through-put. Furthermore, so-called PVD methods (physical vapor deposition method), such as a spattering method and the like, do not have selectivity in forming a film, and so a metallic film must be formed on the whole surface of the substrate uniformly. Therefore, it is impossible to metallize only the interlayer connecting portion. On the other hand, a film formed by the CVD method has problems, such as a large content of impurities and a low purity. The decrease in purity causes such problems as an increase in the electrical resistance and a decrease in the reliability.

Regarding thin film multilayered substrates and build-up substrates, a method of filling micro via-holes using the techniques of electroless plating or electroplating has been disclosed, but control of film thickness is difficult. For instance, In accordance with JP-A-6-302965 (1994), the via-holes are filled by plating. However, in this case, since the control of the plated film thickness is extremely difficult, a final polishing step is required. A method of filling the inside of via-holes by electroplating or electroless plating has been disclosed in JP-A-5-335713 (1993). However, in accordance with the above prior arts the filling of the via-holes by electroless plating is impossible. Because the electroless plating reaction proceeds also on the end plane of the conductor surface at the upper layer of the via-holes, the opening of the via-hole is decreased with elapsed plating time and finally is closed. In this case, a space in the form of a void remains inside the via-hole, and the reliability of the substrate is significantly decreased.

In the case of electroplating, the plating reaction proceeds at the end plane of the conductor surface at the upper layer of the via-holes from the moment when the metal plated from the bottom portion of the via-hole reaches the end plane of the conductor surface at the upper layer of the via-holes, and so the opening of the via-hole will become closed in those cases where the diameter of the via-hole is less than two times the conductor thickness. In this case, a space in the form of a void again remains inside the via-hole, resulting in a problem in that the reliability of the substrate is significantly decreased. When the diameter of the via-hole is larger than two times the conductor thickness, the opening of the via-hole will not become closed, but the shape of the plating, when it reaches the conductor surface, is not "columnar" like the shape when plating the inside of the via-hole, but is "a mushroom shape". This is because the plating reaction does not indicate any anisotropy, but the metal grows in an isotropic manner.

As explained above, when filling metal into a micro hole using a dry metallizing method, problems occur in that the manufacturing steps become complex because the PVD method does not have selectivity, and so a polishing step becomes necessary, and in that the production yield is decreased because the stress applied to the substrate when polishing is significant. Because the CVD method uses a compound containing a chemical element other than a metal as the raw material, the obtained metal contains a large amount of impurities. The increase in impurity concentration causes problems, such as an increase in the electric resistance, a decrease in the reliability, and the like. The problems inherent in use of the metallizing method as a whole are a high apparatus cost, because the apparatus requires a vacuum system, and a low through-put.

On the contrary, when filling metal into a micro hole using a wet metallizing method, either the electroplating method or the electroless plating method can be used.

In accordance with the electroplating method, an electricity supplying layer for supplying an electric current for the plating is required as a base layer. A first conductive layer is previously not used for patterning, but necessarily is used as the electricity supplying layer first. Accordingly, the inside of the via-holes is filled by plating first, then, the insulating layer is peeled off, and patterning of the first conductive layer is performed. Subsequently, the insulating layer is formed again, and polishing is performed in order to flatten the surface and determine the via-hole filling metal. The polishing step is one of the problems, because the step requires a long time, and this decreases the production yield because the stress applied to the substrate is significant.

When the electroless plating method is used, the plating reaction proceeds from only the surface of a first conductive layer, and the inside of the via-hole is filled with the plated metal. In this case, a second conductive layer on the surface of the insulating layer is necessarily formed after filling the via-holes. Because, if the plating is performed in the presence of the second conductive layer, the plating reaction also will proceed from the surface of the second conductive layer, and the openings of the via-holes will close. When the plating reaction proceeds from the surface of the first conductive layer to fill the inside of the via-holes with the plated metal, control of the plated film thickness is extremely difficult. When the plated film thickness is small, a break in the wiring is possible, and when the plated film thickness is large, the flatness of the surface is lost, and so problems are generated informing the multilayered structure.

Therefore, in accordance with the prior art, the inside of the via-holes has been filled with metal by the steps of thickening the plated film thickness somewhat, causing the plated metal to protrude from the insulating layer, in order to eliminate possibility of a break in the wiring caused by deficiency of the plated film thickness, and subsequently, polishing off the excess portion of the plated metal to flatten the surface. However, the polishing step in this process requires a long time, as explained above, and the production yield is decreased by the significantly large stress applied to the substrate.

SUMMARY OF THE INVENTION

One of the objects of the present invention is to provide a circuit board, which makes it possible to identify via-hole portions, on the surface of a substrate, in order to facilitate formation of a multilayered structure with the substrate, which via-holes have been previously filled with metal.

The second object of the present invention is to provide a method of manufacturing a circuit board, which makes it possible to fill metal into the via-holes with good reproducibility and uniformly, by electroless plating, a process with which it has been difficult heretofore to control the film thickness.

In accordance with the present invention, when via-holes are filled by electroless plating, the plating is performed while applying a potential higher than the reaction potential of the electroless plating reaction to the surface conducting layer. The electroless plating grows upwards from the bottom of the via-hole, and the via-hole is completely filled. When the plated metal filling the via-hole reaches the surface conducting layer, the electroless plating reaction automatically stops, because the surface conducting layer is charged with a potential higher than the reaction potential of the electroless plating reaction by the external power supply. As explained above, the plating reaction can be stopped entirely when the plated metal surface reaches the surface conducting layer in all the via-holes. Therefore, it becomes possible to control, with good reproducibility and uniformly, the thickness of the plated metal, which heretofore has been extremely difficult to control.

In accordance with the circuit board manufactured by the method of the present invention, the via-hole portion can be identified, even after a conducting layer covering surfaces of both the via-holes filled with the plated metal and the insulating layer are formed, by observing the surface of the conducting layer.

The circuit board of the present invention includes a conductor connecting portion having a structure such that a first conductor is formed on an insulating substrate, an insulating layer is formed on the insulating substrate and the first conductor, a second conductor is formed on the insulating layer, via-hole for electrically connecting the first conductor and the second conductor are formed in the insulating layer, and the inside of the via-holes are filled with a third conductor, the invention being characterized in that the via-hole portion can be identified from a surface condition of a fourth conductor covering the surface of both the second conductor and a third conductor. In this regard, the surface condition of the fourth conductor differs from the surface of the second conductor and the third conductor, or the surface condition of the fourth conductor changes on a boundary region of the second conductor and the third conductor.

The identification of the via-hole from the surface of the fourth conductor can be performed, for instance, by visual observation with a microscope, methods of utilizing differences in reflective index, or luster, or an optical method, such as image analysis and the like.

Further, the circuit board of the present invention includes a conductor connecting portion having a structure such that a first conductor is formed on an insulating substrate, an insulating layer is formed on the insulating substrate and the first conductor, a second conductor is formed on the insulating layer, via-holes for electrically connecting the first conductor and the second conductor are formed in the insulating layer, and the inside of the via-holes are filled with a third conductor, the invention being characterized in that, for a circuit board comprising a fourth conductor covering the surface of both the second conductor and a third conductor, the fourth conductor is formed to have an area in the shape of dent above the third conductor.

Furthermore, the circuit board of the present invention includes a conductor connecting portion having a structure such that a first conductor is formed on an insulating substrate, an insulating layer is formed on the insulating substrate and the first conductor, a second conductor is formed on the insulating layer, via-holes for electrically connecting the first conductor and the second conductor are formed in the insulating layer, and the inside of the via-holes are filled with a third conductor, the invention being characterized in that, the circuit board is provided with a fourth conductor covering the surface of both the second conductor and a third conductor.

Furthermore, the circuit board of the present invention includes a conductor connecting portion having a structure such that a first conductor is formed on an insulating substrate, an insulating layer is formed on the insulating substrate and the first conductor, a second conductor is formed on the insulating layer, via-hole for electrically connecting the first conductor and the second conductor are formed in the insulating layer, the inside of the via-holes are filled with a third conductor, and a fourth conductor covers the surface of both the second conductor and the third conductor, the invention being characterized in that the third conductor has the same height as the thickness of the insulating layer.

A method of the present invention for manufacturing a circuit board, which includes a first conductor formed on an insulating substrate, an insulating layer formed on the insulating substrate and the first conductor, a second conductor formed on the insulating layer, via-holes for electrically connecting the first conductor and the second conductor formed in the insulating layer, and metal filling the inside of the via-holes, is characterized by filling the inside of the via-holes with plated metal by applying a potential higher than the potential of the plating reaction to the second conductor when the third conductor is filled into the via-holes by electroless plating, and the electroless plating reaction is initiated from the first conductor at the bottom of the via-hole.

Further, a method of the present invention for manufacturing a circuit board is characterized by the steps of forming an insulating layer onto an insulating substrate having a first conductor on its surface, forming a second conductor on the insulating layer, patterning the second conductor, forming via-holes into the insulating layer on the first conductor using the second conductor as a mask, and forming a third conductor by filling metal into the via-holes by electroless plating onto the first conductor at the bottom of the via-hole while applying a potential higher than the potential of the plating reaction to the second conductor.

Furthermore, a method of the present invention for manufacturing a circuit board is characterized by the steps of laminating an insulating layer in a film shape having a second conductor on its surface onto an insulating substrate having a first conductor on the surface thereof, patterning the second conductor, forming via-holes into the insulating layer reaching the first conductor using the second conductor as a mask, and forming a third conductor by filling metal into the via-holes by electroless plating onto the first conductor at the bottom of each via-hole while applying a potential higher than the potential of the plating reaction to the second conductor.

In accordance with the present invention, the object of the invention is achieved by forming a second conductor at a location where it is insulated electrically and is separated from a substrate which is going to be plated by a distance to be plated, as explained above, and performing electroless plating while applying a potential higher than the potential of the plating reaction to the second conductor.

The method of electroless plating of the present invention includes the steps of forming a first conductor, and a second conductor which is insulated electrically from the first conductor, on a substrate which is going to be plated, and mounting a further conductor on the surface of the first conductor by electroless plating, characterized in that a potential higher than the potential of the plating reaction is applied to the second conductor.

When filling a desired amount of metal into micro holes or grooves by electroless plating, a potential higher than the potential of the plating reaction is applied to a second conductor on the surface of the insulating layer in the vicinity of the micro holes or the grooves from an external power source.

The method of electroless plating of the present invention includes the steps of forming holes or grooves in a substrate which is going to be plated, forming a second conductor in the vicinity of the holes or the grooves on an insulating body, and effecting an electroless plating reaction originated from the first conductor so as to fill metal into the holes or the grooves, characterized in that a potential higher than the potential of the plating reaction is applied to the second conductor from an exterior power source.

The potential to be applied to the second conductor is desirably +0.1–+1.5 Volt relative to the potential of the electroless reaction, and preferably is +0.4–+0.7 Volt.

Typical examples of the micro holes to be filled with metal according to the present invention are interlayer connecting portions of an IC, interlayer connecting portions of thin film multilayered circuit boards or printed circuit boards, and the like. However, the present invention can be applied additionally to the filling of metal into arbitrary blind holes formed in an insulator. The shape and material of the insulating body having the holes to be filled with metal are not specified particularly. The structures to which the present invention can be applied are not only holes but also grooves, and the present invention is applicable to the step of forming circuits.

In a module including a multilayered thin film circuit board, which is manufactured by laminating plural insulating layers having micro circuit patterns formed on their surface, and mounting semiconductor elements on at least one side plane of the circuit board, the present invention is characterized in that the multilayered thin film circuit board is composed of the circuit board described previously.

In a mounted device of a large scale computer comprising module substrates mounted and connected to printed boards via connecting pins; multilayered thin film circuit boards, which are manufactured by laminating plural insulating layers having micro circuit patterns formed on their surface, and mounting semiconductor elements on at least one side plane of the circuit board, the present invention is characterized in that the multilayered thin film circuit board is composed of the circuit board described previously.

DESCRIPTION OF THE PREFERRED EMBODIMENTS (Embodiment A)

Figure 1:
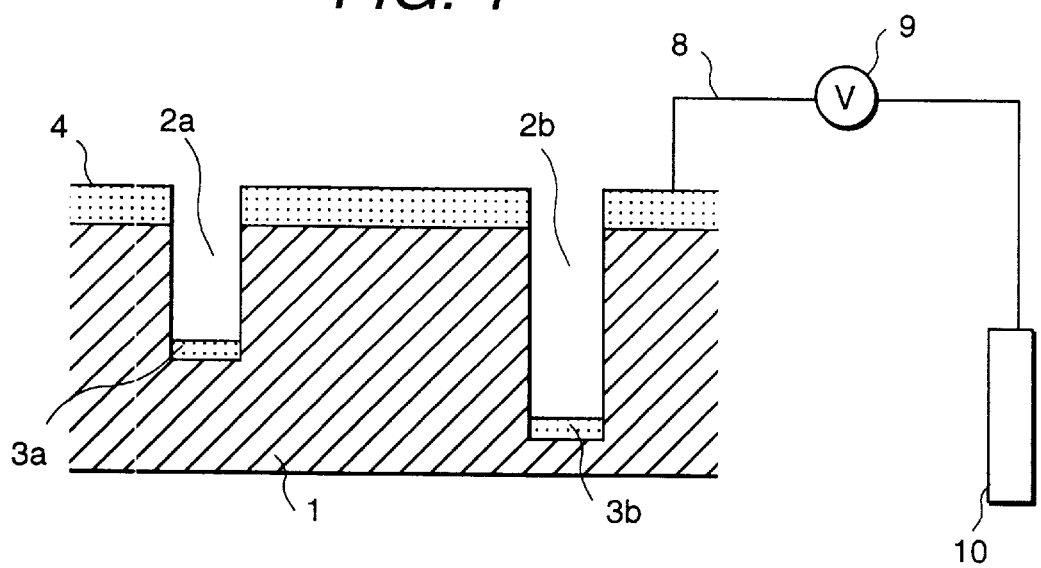
FIG. 1 is a schematic cross section indicating an example of an arrangement when the present invention is applied for filling metal into a hole or a groove.

FIG. 1 is a cross section indicating an example of an arrangement in a case when the present invention is used for filling metal into a hole or a groove. Holes or grooves 2*a*, 2*b*, are provided in an insulating material 1, and first conductors 3*a*, 3*b* composed of metallic layer and the like are formed on the bottom of the holes or the grooves. A second conductor 4 composed of metallic layer and the like is formed on the surface of the insulating material. Now, the inside of the holes or the grooves 2*a*, 2*b* is going to be filled with metal so as to form a third conductor by electroless plating initiated from the conductors 3*a*, 3*b* provided at the bottom of the holes or the grooves 2*a*, 2*b*. In accordance with the present invention, the electroless plating is performed while applying a potential higher than the potential of the plating reaction to the second conductor 4 provided on the surface of the insulating material 1.

The potential higher then the potential of the plating reaction is applied to the second conductor 4 from an external power source 9 as a designated potential by taking a potential of a reference electrode 10 immersed into the electroless plating solution as a reference potential. The external power source 9 is connected to the second conductor 4 with electric wires 8. When the electroless plating is performed in a manner as described, the electroless plating initiated from the conductors 3a, 3b provided at the bottom of the holes or the grooves 2a, 2b to form the third conductor gradually increases the thickness of the plated metal, and fills the holes or the grooves 2a, 2b. When the upper end of the plating metal contacts the second conductor 4, the plating reaction is stopped, and the thickness of the plating metal does not increase any more. This situation similar with a case when the holes or the grooves 2a, 2b having different depth from each other exist concurrently as indicated in FIG. 1.

Thus, the plating metal filling the shallow hole or the groove 2a increases its thickness so as to reach the second conductor 4 in a relatively short time, and stops filling the hole or the groove 2a at the moment when a part of the plating metal touches the second conductor 4. On the contrary, the plating metal filling the deep hole or the groove 2b requires a relatively long time to reach the second conductor 4. However, the electroless plating reaction to fill the deep hole or the groove 2b is continued until the plating metal filling the hole or the groove 2b touches the second conductor 4, even after the electroless plating to fill the shallow hole or the groove is finished. In this manner, all the holes or the grooves can be filled uniformly with plated metal to the height of the second conductor 4, even if plural holes or grooves 2a, 2b having different depths are provided randomly in the insulating material 1.

The second conductor 4, to which a voltage is applied from the external power source 9, can be arranged not only at the upper end of the hole or the groove to be filled by the electroless plating, but also at a midpoint in a depth direction of the hole or the groove. In this case, the thickness of the plated metal can be controlled, because the position where the electroless plating reaction stops can be controlled by regulating the position where the second conductor is placed, that is, the height from the first conductor 3a, 3b where the electroless plating is initiated.

Figure 2:
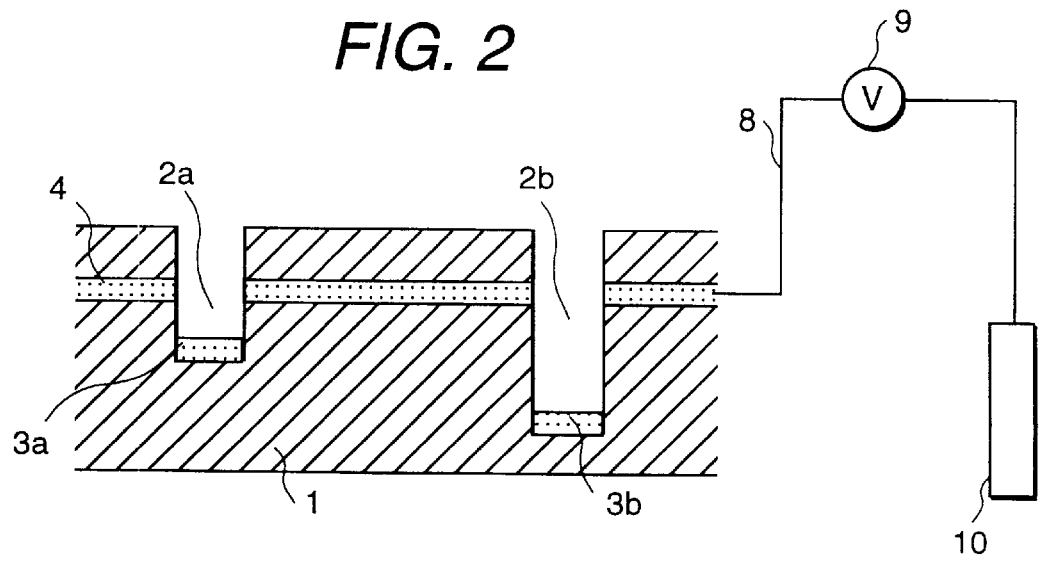
FIG. 2 is a schematic cross section indicating an example of an arrangement when the plating reaction is stopped at a midpoint of filling the metal.

FIG. 2 is a schematic cross section showing an arrangement in which the second conductor 4 is positioned to stop the plating reaction at a midpoint of the filling operation of the hole or the groove by providing the second conductor 4 at a halfway point in a depth direction of the hole or the groove 2a, 2b having a first conductor 3a, 3b, by which the electroless plating is initiated at the bottom. The arrangement differs from FIG. 1 in providing the second conductor 4, to which a potential higher than the potential of the plating reaction is applied, not on the surface of the insulating material 1, but inside the insulating material 1.

The end plane of the second conductor 4 is exposed at the side plane of the hole or the groove provided in the insulating material 1. In this case, all the holes or the grooves having different-depths from each other provided in the insulating material 1 can be filled, uniformly to the position of the second conductor 4, with plated metal to form the third conductor.

The second conductor can be placed into the plating solution separated from the substrate which is going to be plated. As explained above, the present invention can be applied not only to holes or grooves provided in the insulating material, but also to a case where the surface of a flat body is plated by electroless plating. The thickness of the plated film on the substrate which is going to be plated can be controlled arbitrarily by regulating the position where the second conductor is provided.

Figure 3:
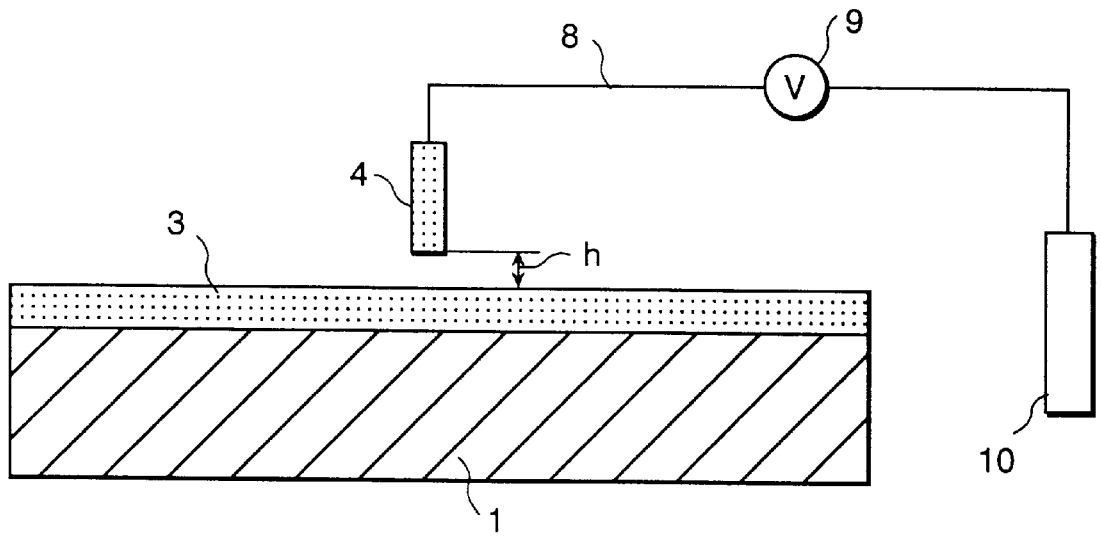
FIG. 3 is a schematic cross section indicating an example of an arrangement when the plating of a designated thickness is performed on surface of a body to be plated by electroless plating.

FIG. 3 is a schematic diagram showing an example of an arrangement in which plating a layer having a designated thickness is performed on the surface of a body to be plated by electroless plating. The second conductor 4 charged with a potential higher than the potential of the plating reaction by an external power source 9 is fixed in the plating solution at a position separated by a distance h from the surface of the body 1 to be plated having the first conductor 3, which initiates the electroless plating. The body 1 to be plated is not necessarily restricted to a flat body such as a flat board, but can be any body having a continuous surface. For instance, the body 1 to be plated can be a sphere, a cylinder, and a body fabricated in a particular shape. If the electroless plating is performed in an arrangement such as described above, the plating reaction is stopped at the moment when the metal formed on the first conductor 3 of the body 1 to be plated comes into contact with the second conductor 4. Therefore, a uniform plated film having a thickness of h can be formed on the body 1 to be plated.

As explained above, the present invention can be applied to all bodies to be plated having various shapes when electroless plating is performed, and the thickness of the plated film can be controlled arbitrarily by regulating the position of the second conductor, to which a potential higher than the potential of the plating reaction is applied, by any means.

Next, the theory of the present invention will be explained taking electroless copper plating as an example. The electroless copper plating reaction can be expressed by the following reaction equation (chem. 1).

$$Cu^{2+}(L)+2HCHO+4OH^- \rightarrow Cu+2HCOO^{2-}+2H_2O+H_2+L \quad \text{(chem. 1)}$$

Where, L is a complex forming agent which forms a complex compound with copper, and ethylenediaminetetraacetic acid (EDTA) is frequently used as the agent L. The reaction expressed by the above reaction equation (chem. 1) proceeds selectively on metals such as copper, palladium, and the like, and the reason for this is assumed to be that these metals have a catalytic activity for an oxidation reaction of formaldehyde. Formaldehyde releases electrons when it is oxidized, and copper ions which accept the electrons are reduced to metallic copper and deposited. The deposition reaction of copper is produced with a negative potential (a minus potential) lower than approximately −0.8 V at room temperature taking a saturated calomel electrode (SCE) as a reference. Accordingly, in accordance with the electroless copper plating reaction, wherein an oxidation reaction of formaldehyde and the reducing deposition reaction of copper ions proceed concurrently, the surface potential of the body to be plated becomes negative and lower than −0.8 V at room temperature (vs. SCE). When actually performing electroless plating, the plating solution is frequently used after heating it to approximately 60–80° C. in order to ensure a deposition rate of the plated metal. However, the theory of the present invention is the same, although the potential differs from the potential at room temperature. When the plating is performed at approximately 70° C., the potential of the body to be plated is observed to be approximately −0.75 V (vs. SCE).

In order to reduce and deposit copper ions by the electroless plating reaction, a negative potential lower than −0.8 V at room temperature (vs. SCE) (−0.75 V at 70° C. (vs. SCE)) is necessary. Therefore, if the potential of the body to be plated is charged by any means to a potential higher than the potential for reducing the copper ions, that is, higher than −0.8 V at room temperature (vs. SCE) (−0.75 V at 70° C. (vs. SCE)), the plating reaction can be stopped. The plating reaction can be stopped, when the plated film becomes an arbitrary desired thickness, by applying a potential higher than the reducing potential of the plating metal ions from an external power source to the plated surface as explained above.

The potential necessary for stopping the plating reaction differs depending on the plating system. However, the range of the potential generally can be +0.1–+1.5 V relative to the potential of the body to be plated while the plating reaction is proceeding. If the applied potential is smaller than +0.1 V, the potential is sometimes insufficient for producing its effect, and the plating reaction can not be stopped. On the contrary, an applied potential larger than +1.5 V is not desirable, because the second conductor, to which the potential is applied, will become oxidized. In some cases depending on the material of the second conductor, the oxidation of the second conductor forms a passive layer, or dissolves the second layer into the plating solution. In accordance with an investigation by the present inventors, the plating reaction could be stopped by applying a potential in the range of +0.1–+1.5 v refers to the potential of the plating reaction, but the application of a potential in the range of +0.4–+0.7 V produced the most preferable result.

In a circuit board manufactured by a build-up method, wherein insulating layers are formed on a substrate and circuits are formed and connected to each other sequentially by via-holes, the circuit board generally has holes even after forming the conductors, because the inside of the via-holes is not filled with metal. The presence of the holes is disadvantageous from the view point of increasing the circuit density. This situation is similar with the plating method, as well as with dry metallization methods, such as spattering and the like. Therefore, a method, wherein the inside of the via-holes is completely filled by the electroless plating method, can be deemed as advantageous from the view point of increasing the circuit density. However, controlling the thickness of the plated film is difficult, and a subsequent polishing process typically is required. The conducting layer, which is formed so as to cover both the via-hole surface and the insulating layer surface after the polishing process, makes it impossible to align circuit patterns, because the position of the via-holes can not be identified by visual observation.

In accordance with the present invention, a circuit board has been provided wherein the position of the via-holes can be identified from the surface of the conducting layer, which is formed so as to cover both the via-hole surface and the insulating layer surface, and an upper layer via-holes can be formed exactly on the lower layer via-holes. Structures of the circuit board are indicated as cross sections in FIG. 4 and FIG. 5.

Figure 4:
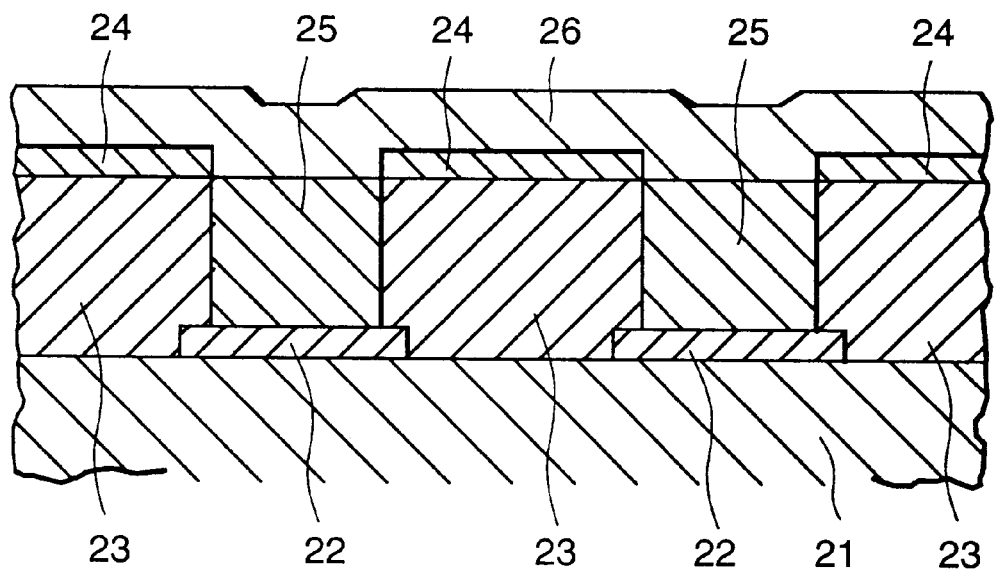
FIG. 4 is a schematic cross section of an example of the circuit board according to the present invention.

The circuit board illustrated in FIG. 4 was manufactured by the steps of forming via-holes in the insulating layer 23 formed on the insulating substrate 21, wherein the insulating layer 23 has a first conductor 22 on its surface; forming the third conductor 25 by filling plating metal into the inside of the via-holes by electroless plating reaction originated from the first conductor 22 at the bottom of the via-holes while applying a potential higher than the potential of the plating reaction to the second conductor 24 on the insulating layer 23; and then forming the fourth conductor 26 thereon. The second conductor 24 and the fourth conductor 26 can be made of the same metal or different metals.

When a circuit board having the structure indicated in FIG. 4 is observed from the top of the board, slight bumps and dips can be identified on the surface of the fourth conductor 26 formed on the upper plane of the insulating layer 23. The dip portion corresponds to the via-hole portion which is filled with the third conductor 25 of plated metal, and so an alignment with a mask for patterning the conducting layer is possible. The bumps and dips are hardly identified when the second conductor 24 is very thin, or the fourth conductor 26 is very thick. However, since the surface of the third conductor 25 formed inside the via-holes is not polished, the roughness of the surface at the via-holes portion is different from other portions after forming the fourth conductor 26. Therefore, the via-holes can be identified by visual observation from the top of the circuit board.

Figure 5:
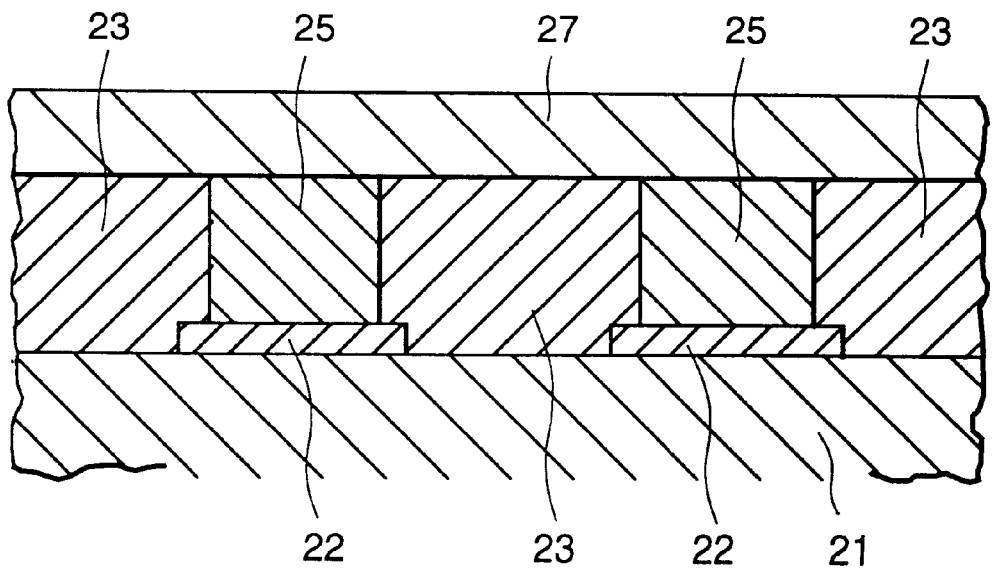
FIG. 5 is a schematic cross section of another example of the circuit board according to the present invention.
Figure 6A:
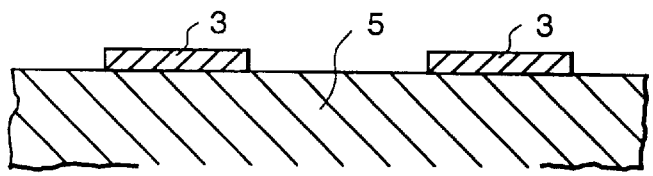
FIGS. 6(*a*) to 6(*f*) are schematic cross sections indicating steps in the method of electroless plating of the present invention.
Figure 6B:
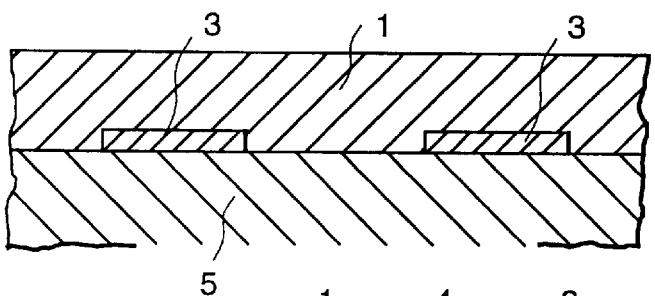
Figure 6C:
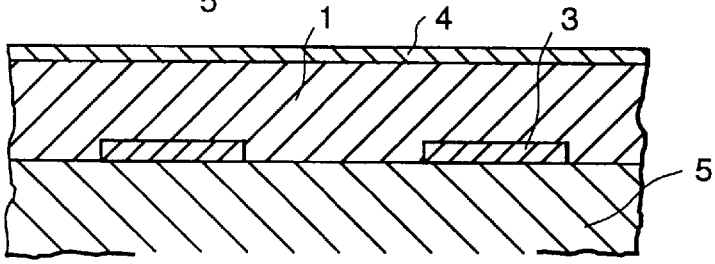
Figure 6D:
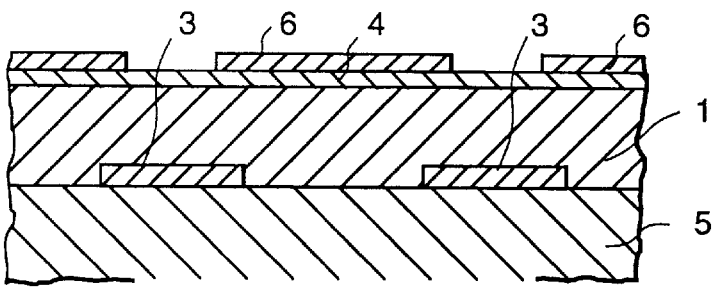
Figure 6E:
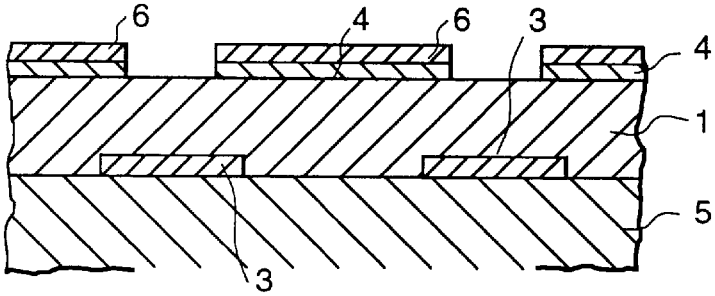
Figure 6F:
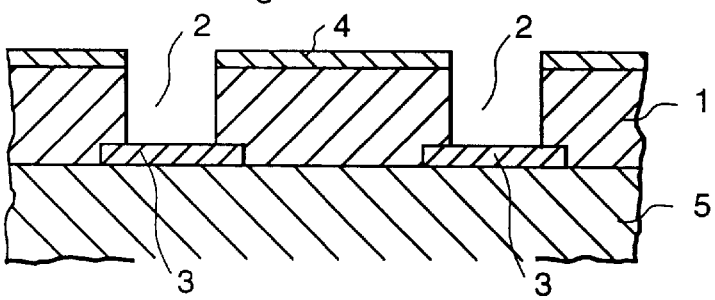

The circuit board indicated in FIG. 5 was manufactured in a similar manner as the circuit board indicated in FIG. 4 by the steps of forming the third conductor 25 by filling plating metal into the via-holes; removing the conductor 24 (refer to FIG. 4) on the insulating layer 23 by etching and the like; and then forming the conducting layer 27 all over the plane surface. The via-holes can be identified by the surface roughness, even in a case of a circuit board having the structure indicated in FIG. 5.

As explained above, the present invention can be applied to various bodies to be plated and their structures. However, a case where the present invention is applied to fill plating metal into small holes provided at a multilayered circuit board will be explained hereinafter.

In a circuit board manufactured by a build-up method, wherein an insulating layer is formed on a substrate and circuits are connected sequentially via small holes, establishment of a technique for connecting interlayer circuits via small holes is indispensable for increasing the circuit density. Particularly, the interlayer connection by via-holes of one end closed type, which connects only necessary circuits, is important. Methods for forming the via-holes include a laser manufacturing method using any of an excimer laser, a carbon dioxide laser, and the like, a photographic method using a photosensitive resin as the insulating layer, a dry etching method using an etching plasma, and others. In order to achieve a high density circuit formation of circuit boards, decreasing a pad area necessary for connecting inter layer circuits is important in addition to decreasing the width of the wiring.

In order to decrease the pad area, a method of filling the inside of the via-holes with metal is effective. However, as described previously, filling the inside of the via-holes with metal is difficult with any conventional dry metallization method or wet metallization method.

An example of applying the present invention to the filling of via-holes in a build-tip substrate with metal by electroless plating will be explained hereinafter.

Figure 7:
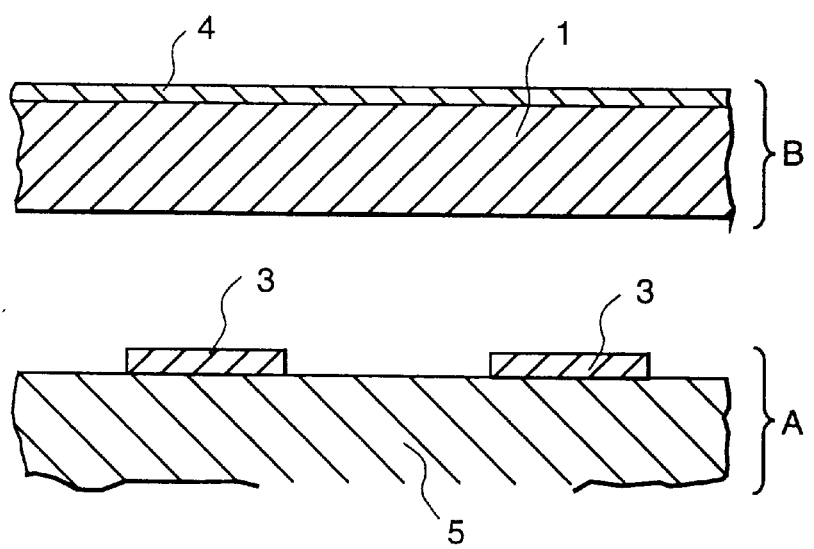
FIG. 7 is a schematic cross section indicating another example of steps for forming an insulating layer and a conductor on a substrate.

The explanation will refer to the process flow indicated in FIGS. 6(*a*) to 6(*f*). The substrate 5 has a first conductor 3 on the surface, as indicated in FIG. 6(*a*). The insulating layer 1 is formed on the surface of the substrate 5, as indicated in FIG. 6(*b*). Subsequently, a second conductor 4 is formed on the surface of the insulating layer 1, as indicated in FIG. 6(*c*). The formation of the second conductor 4 can be performed by any dry metallizing method, such as spattering, vapor deposition, and the like, or by a wet metallizing method, such as electroless plating and electroplating. Also, a metallic film can be adhered by thermo compression or with an adhesive agent to the surface of the insulating layer 1. Otherwise, as indicated in FIG. 7, an insulating layer film (indicated by B) having a previously formed metallic film 4 on its surface can be laminated onto the surface of the substrate 5 (indicated by A), whereon the first conductor 3 has been formed.

Then, as indicated in FIG. 6(*d*), a photosensitive resist 6 is formed on the second conductor 4, and a pattern is formed by a photographic method. The pattern is formed so that only portions of the second conductor 4 where via-holes should be formed in the insulating layer 1 are etched. Subsequently, etching is performed for patterning the second conductor 4, as indicated in FIG. 6(e), and the resist is peeled off, if necessary. Then, via-holes 2 are formed in the insulating layer 1 by laser or plasma processing using the second conductor 4 as a mask, as indicated in FIG. 6(f). The via-hole forming operation is finished when the via-hole reaches the surface of the first conductor 3.

Figure 8:
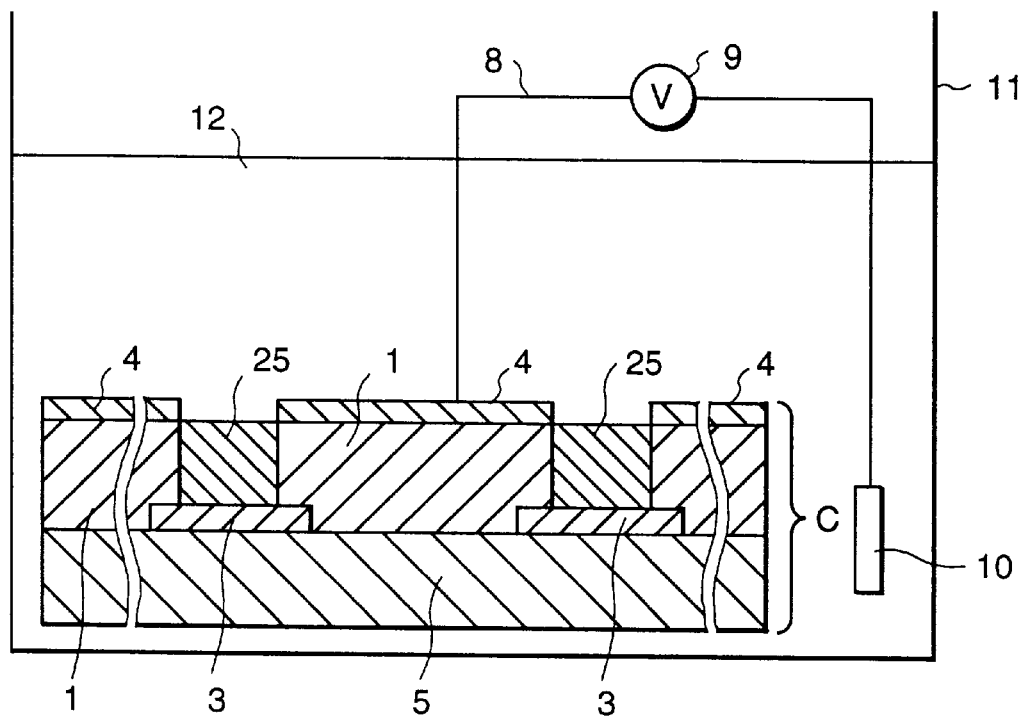
FIG. 8 is a diagram for explaining the operation of an apparatus for performing electroless plating.

Then, after cleaning, the substrate C is immersed into the electroless plating solution 12 in the plating vessel 11, as seen in FIG. 8, and electroless plating is performed using the surface of the first conductor 3 at the bottom of the via-hole 2 as an initiating point. During the electroless plating process, a potential higher than the potential of the electroless plating reaction is applied to the second conductor 4 on the surface of the substrate from the external power source (potentiostat) 9. Practically, for instance in electroless copper plating, the potential of electroless copper plating reaction at a plating temperature of 70° C. is approximately −750—800 mV (vs. SCE). Therefore, a potential is applied from the external power source 9 via wires 8 so that the second conductor 4 becomes approximately −300 mV (vs. SCE).

The above example is a case when the potential is applied in comparison with the reference electrode 10 of SCE (Saturated Calomel Electrode). However, the reference electrode 10 is not restricted to an SCE. Furthermore, using no reference electrode, a potential higher by, for instance, approximately 500 mV than the other substrate, whereon an electroless plating is performing, can be applied to the second conductor 4 by an external power source. In the above case, the surface area of the other substrate used as a reference of the applied potential is desired to be sufficiently larger than the surface of the second conductor 4.

The electroless plating progresses upward from the bottom of the via-hole 2, and finally the via-hole 2 is completely filled with plated metal. When the plated metal 25, which has filled the inside of the via-hole, reaches the second conductor 4, the electroless plating is stopped, because a potential higher than the potential of the electroless plating reaction is applied to the second conductor 4.

As explained above, the plating reaction at all the via-holes 2 can be slopped when the plated surface reaches the conductor 4 by performing the-electroless plating while applying a potential higher than the reaction potential of the electroless plating reaction to the second conductor 4 when the inside of the via-holes 2 is filled with the electroless plated metal. Therefore, control of the plated film thickness, which has been extremely difficult heretofore, can be performed with a desired reproducibility.

Figure 9:
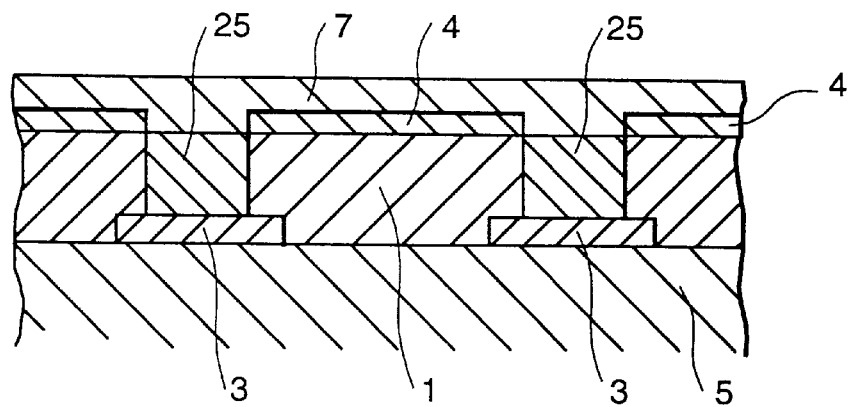
FIG. 9 is a schematic cross section of an example of the thin film multilayered circuit substrate according to the present invention.

After filling the via-hole with the electroless plated metal, a conducting layer 7 is further formed, as indicated in FIG. 9, in order to improve the reliability of the electrical connection of the third conductor 25 composed of the via-hole filling metal and the second conductor 4. The conducting layer 7 can be formed by any method, such as electroless plating, electroplating, dry metallizing, and the like. The conducting layer 7 can also be formed on all the surface after first removing the second conductor 4 by etching, and the like.

The first conducting layer 3, the second conductor 4, the conducting layer 7, and the via-hole filling metal 25 can be formed with the same metal or different metals. And, the respective conductors can be made of a single kind of metal, a multilayered structure conductor, or an alloy of various kinds of metals.

The desirable materials for the first conducting layer 3 are copper, nickel, silver, gold, platinum, zinc, palladium, rhodium, tungsten, chromium, titanium, and cobalt. Particularly, copper, silver, and gold, all of which have a smell electrical resistance, are preferable. A multilayered structure or an alloy can be used in consideration of the adhesiveness at boundary planes of the first conducting layer 3 with the base substrate, the insulating layer, and the like. Since the first conducting layer 3 is the initialing point of the electroless plating reaction for filling the via-holes, it is necessary for an active metal for the electroless plating reaction to exist on the surface of the first conducting layer 3, or to be exposed or precipitated on the surface by any means, such as etching and the like. On the other hand, no other restriction is necessary.

The desirable materials for the second conductor 4 are copper, nickel, silver, gold, platinum, palladium, rhodium, tungsten, chromium, titanium, aluminum, cobalt, and iron. Particularly, copper, silver, and gold, all of which have a smell electrical resistance, are preferable. A multilayered structure or an alloy can be used in consideration of the adhesiveness with the insulating layer and the first conducting layer 3.

The desirable materials for the fourth conductor 7 are copper, nickel, silver, gold, platinum, palladium, rhodium, tungsten, chromium, titanium, and cobalt. Particularly, copper, silver, and gold, all of which have a small electrical resistance, are preferable. A multilayered structure or an alloy can be used in consideration of the adhesiveness at the boundary plane with the second conductor 4, the insulating layer, and the like.

Any metals, which are capable of electroless plating, are usable for the third conductor 25 as the via-hole filling metal. For instance, copper, nickel, silver, gold, palladium, solder, and cobalt can be used. In the case of nickel, an alloy of nickel with phosphorus or boron may be used depending on the kind of reducing agent.

(Embodiment B)

Hereinafter, another embodiment of the present invention will be explained. However, the shape and materials of the insulating layers, the kinds of conducting metals, and other factors described here are only examples for explaining the present invention, and the present invention is not restricted to such examples.

The following substrates and treating solutions were prepared:

(1) Substrate A

A copper clad laminated board having a copper foil 18 μm thick on one plane of a glass epoxy base material.

(2) Substrate B

A copper clad laminated board having a copper foil 18 μm thick on one plane of a glass epoxy base material; on which an etching resist was formed, copper patterns were formed by etching, and the surface of the copper was roughened by a subsequent chemical oxidizing treatment, such as immersing the substrate into an oxidizing treatment solution.

(3) Substrate C

A ceramic circuit substrate manufactured by printing a designated pattern with tungsten paste onto a surface of a ceramic green sheet by screen printing, laminating 15 layers, and sintering simultaneously.

(4) Substrate D

A ceramic circuit substrate manufactured by priming a designated pattern with copper paste onto a surface of a ceramic green sheet by screen printing, laminating 15 layers, and sintering simultaneously.

(5) Substrate E
A substrate manufactured by forming a chromium film 0.05 μm thick on the surface of a polyimide film by spattering, forming a copper film 5.0 μm thick, then, a chromium film 0.05 μm thick is formed again; subsequently, forming an etching resist, and forming a three layered conducting pattern of chromium/copper/chromium by etching.

(6) Substrate F
A substrate manufactured by forming a titanium film 0.05 μm thick on the surface of a polyimide film by spattering, forming a copper film of 5.0 μm thick, then, a titanium film 0.05 μm thick is formed again; subsequently, forming an etching resist, and forming a three layered conducting pattern of titanium/copper/titanium by etching.

(7) Substrate G
A glass substrate having patterned copper on its surface.

(8) Substrate H
A glass substrate having patterned nickel on its surface.

(9) Substrate I
A glass epoxy substrate having a patterned three layered conducting pattern of copper/nickel/gold on its surface.

(10) Substrate J
A glass epoxy substrate having patterned silver, manufactured by printing the pattern with silver paste on the surface of the substrate by screen printing, and then hardening by heating.

(11) Substrate K
A silicon wafer having on its surface a patterned aluminum electrode, the surface of which was treated with zinc (zincate treatment).

(12) Substrate L
A silicon wafer having patterned tungsten on its surface.

(13) Substrate L
A silicon wafer having patterned titanium on its surface.

| (14) An oxidizing treatment solution | |
|---|---|
| Sodium chlorite | 1.0 mol/liter |
| Sodium phosphate | 0.1 mol/liter |
| Sodium hydroxide | 0.4 mol/liter |
| Temperature ot the solution | 70° C. |
| (15) An electroless Ni—P plating solution | |
| Nickel sulphate | 0.08 mol/liter |
| Lactic acid | 0.3 mol/liter |
| Propionic acid | 0.03 mol/liter |
| Sodium hypophosphite | 0.2 mol/liter |
| pH | 5.0 |
| Temperature of the solution | 70° C. |
| (16) An electroless copper plating solution | |
| Copper sulphate | 0.04 mol/liter |
| Ethylenediaminetetraacetic acid | 0.1 mol/liter |
| Formaldehyde | 0.03 mol/liter |
| Sodium hydroxide | 0.1 mol/liter |
| 2,2'-bipyridyl | 0.0002 mol/liter |
| Polyethylene glycol (average molecular weight 600) | 0.03 mol/liter |
| pH | 12.8 |
| Temperature of the solution | 70° C. |
| (17) An electroless cobalt plating solution | |
| Cobalt sulphate | 0.05 mol/liter |
| Ethylenediamine | 0.4 mol/liter |
| Rochelle salt | 0.05 mol/liter |
| Sodium hydroxide | 0.7 mol/liter |
| Lead chloride | 30 ppm |
| Temperature of the solution | 70° C. |

(Embodiment 1)
The substrate A 100 mm square was immersed into an aqueous solution of ammonium persulfate, 35° C., 200 g/liter, for two minutes for performing a soft etching treatment of copper to expose a clean surface of the copper. A tip of enamel coated wire was fixed at a position separated from the copper surface by 30 μm using a micrometer. The coating of the tip portion of the enamel coated wire was previously removed.

Then, after washing the substrate with water, the substrate was immersed into the electroless copper plating solution for performing electroless copper plating on the surface of the copper. During the plating, a potential of −350 mV (vs. SCE) was applied to the enamel coated wire using a potentiostat. The above potential was applied at 70° C. Since the reaction potential of the electroless copper plating was observed as −780 mv (vs. SCE), the potential actually applied to the enamel coated wire was +0.43 V in comparison with the reaction potential of the copper plating.

Since the plating rate of the electroless copper plating is approximately 3 μm/h, it takes approximately 10 hours for the plated film grown from the copper on the surface of the substrate to touch the tip of the enamel coated wire. Therefore, the electroless copper plating was continued for 15 hours. As a result, it was found that the plating reaction was stopped at the moment when the plated film touched the tip of the enamel coated wire, and the thickness of the plated film was the same as the interval between the tip of the wire and the copper surface of the substrate, i.e. approximately 30 μm. If the plating is assumed to have progressed continuously, plating for 15 hours should generate a plated film 45 μm thick, which significantly exceeds 30 μm, i.e. the interval between the tip of the wire and the copper surface of the substrate. However, actually, the plating reaction was stopped at the moment when the plated film touched the tip of the enamel coated wire, and the thickness of the plated film was the same as the interval between the tip of the wire and the copper surface of the substrate, i.e. approximately 30 μm.

As explained above, it was revealed that the thickness. of the plated film could be controlled arbitrarily by regulating the interval between the second conductor for applying the potential and the substrate when performing electroless plating.

(Embodiment 2)
A polyimide film (copper foil was clad onto one side, mace by Hitachi Chemical Co.: MCF-5000I) was adhered onto a substrate B 100 mm square by interposing a thermosetting adhesive film 25 μm thick mace of mainly epoxy resin, and then heating. The thickness of the copper foil was 18 μm, and the copper foil was clad at the reverse side to the adhesive film. After adhering, a photosensitive etching resist (made by Tokyo Ouka Co.: OFPR-800) was formed on the surface of the copper clad, and the resist at portions to form via-holes was removed by conventional exposure and development. A patterning was performed by etching the copper foil, and subsequently, the etching resist was removed using a conventional removing liquid.

Then, via-holes were formed using an excimer laser. The surface of the substrate was irradiated with a laser beam 20 mm wide. The via-holes were manufactured by a so-called conformal masking method, that is, the copper foil on the surface of the substrate became a mask, and only the patterned portions of the copper foil were manufactured. The formed via-holes were 100 μm in diameter, and a total of 2500 holes were formed with a 2 mm pitch.

After forming the via-holes, the substrate was immersed into the electroless copper plating solution for performing electroless copper plating initiated from the copper pattern on the surface of the glass epoxy substrate. In this case, a potential of −380 mV (vs. SCE) was applied to the copper foil, which was on the surface of the substrate and was used as a mask when forming the via-holes, using a potentiostat. The above potential was applied at 70° C. Since the reaction potential of the electroless copper plating was observed as −780 mV (vs. SCE), the potential actually applied to the copper foil on the surface of the substrate was +0.4 V in comparison with the reaction potential of the copper plating.

The total thickness of the thermosetting adhesive film and the polyimide film is approximately 100 μm. Since the plating rate of the electroless copper plating is approximately 3 μm/h, it takes approximately 33 hours for the plated copper film grown from the copper pattern on the surface of the glass epoxy base material to touch the copper foil on the surface. Therefore, the electroless copper plating was continued for 40 hours. As a result, it was found that the plating reaction at all the 2500 via-holes stopped at the moment when the plated film touched the copper foil on the surface of the substrate, and fluctuation of the film thickness at the 2500 via-holes was equal to or less than ±1 μm.

As explained above, it was revealed that the thickness of the plated film to fill plural via-holes could be controlled arbitrarily by performing the electroless plating while applying a potential to the copper foil on the surface of the substrate, which had been used as a mask when manufacturing the via-holes. Accordingly, it was revealed that the object of the present invention to provide an electroless plating method, which is capable of controlling the film thickness of respective holes, could be achieved by the plating method of the present invention.

Similar experiments as the above were performed while varying the potential applied to the copper foil on the surface to 0.1 V, 0.4 V, 0.7 V, 1.2 V, and 1.5 V in comparison with the plating voltage.

When 0.1 V was applied, copper was precipitated somewhat because of the small applied voltage. Therefore, the thickness of the copper foil on the surface was increased from 18 μm before immersing the substrate into the plating solution to approximately 34 μm after 40 hours at the end of the plating. The copper filled inside the via-hole protruded out from the polyimide surface by approximately 2.8 μm on the average. That means, when a potential of 0.1 V in comparison with the plating potential was applied, it could be assumed that the plating reaction did not stop completely, and the plating reaction continued at a rate of approximately 0.4 μm/h. In accordance with the present embodiment, the plating was continued for 40 hours, notwithstanding the desire to fill up the via-holes with the plated metal in 33 hours. Therefore, the copper filled inside the via-hole protruded out from the polyimide surface by approximately 2.8 μm on the average. However, the above problem can be overcome by optimizing the plating time to approximately 35 hours, because the plating rate when applying 0.1 V is as slow as 0.4 μm/h in comparison with the original plating rate of 3 μm/h.

Under the conditions where the applied potential was 0.4 V and 0.7 V in comparison with the plating potential, the plating reaction at all the via-holes was stopped at the moment when the plated film touched the copper foil on the surface of the substrate during the plating for 40 hours, and fluctuation of the film thickness at 2500 via-holes was equal to or less than ±1 μm.

Under the conditions in which the applied potential was 1.2 V and 1.5 V in comparison with the plating potential, the copper foil to which these potentials were applied became oxidized. Particularly, when 1.5 V was applied, the copper foil was dissolved and the polyimide was partly exposed. However, the plating reaction at the via-holes, in portions where the copper foil still remained, was stopped at the moment when the plated film touched the copper foil on the surface of the substrate. Therefore, it was found that the advantages of the present invention could be achieved substantially even in the above case. Since the oxidation potential, dissolving potential, and dissolving rate of copper vary depending on the pH and temperature of the plating solution, a condition wherein no problems exists can be found even if 1.5 V is applied, if a condition of the pH and the solution temperature differs from the present embodiment, or if the second conductor is composed of a metal other than copper.

In accordance with the above result, it was found that the potential applied to the second conductor should be varied depending on the kind of metal to be plated, and the kind and combination of metals which make up the second conductor, and the advantages of the present invention could be achieved by applying 0.1–1.5 V, and particularly the range of 0.4–0.7 V was preferable.

(Embodiment 3)

A polyimide film 25 μm thick having a copper foil cladding 12 μm thick on one plane was adhered onto a substrate B 100 mm square by interposing a thermosetting adhesive film 75 μm thick made of mainly epoxy resin so that the copper foil was located at the bottom. That is, the structure of the substrate was composed of, from the bottom: glass epoxy base material, copper foil on the epoxy base material, adhesive material, copper foil on the polyimide surface, and polyimide.

The via-holes were manufactured using a short purse carbon dioxide laser until the holes extended to the copper foil on the polyimide surface. Then, the exposed copper foil was etched chemically, and the same laser was used again until reaching the copper on the surface of the glass epoxy base material. Simultaneously, a corner (approximately 5 mm square) was irradiated with the laser for exposing the copper foil on the polyimide surface. The formed via-holes were 100 μm in diameter, and a total of 2500 holes was formed with a 2 mm pitch.

After forming the via-holes, the substrate was immersed into the electroless copper plating solution for performing electroless copper plating initiated from the copper pattern on the surface of the glass epoxy substrate. A potential of −350 mV (vs. SCE) was applied to the copper foil on the polyimide surface, which was exposed partly at the corner of the substrate, by contacting a terminal using a potentiostat. The above potential was applied at 70° C. Since the reaction potential of the electroless copper plating was observed as −780 mV (vs. SCE), the potential actually applied to the copper foil on the surface of the substrate was +0.43 V in comparison with the reaction potential of the copper plating.

The thickness of the thermosetting adhesive film is 75 μm. Since the plating rate of the electroless copper plating is approximately 3 μm/h, it takes approximately 25 hours for the plated copper film grown from the copper pattern on the surface of the glass epoxy base material to touch the copper foil on the polyimide surface. Furthermore, since the total thickness of the thermosetting adhesive film and the copper clad polyimide film formed on the glass epoxy substrate is 112 μm, the plated copper can be reached at the upper plane of the uppermost polyimide film in approximately 37.3 hours if the plating reaction is assumed to progress continuously. Therefore, the electroless copper plating was continued for 40 hours. As a result, it was found that the plating reaction at all the 2500 via-holes was stopped at the moment when the plated film touched the copper foil on the polyimide surface. That is, the plating was performed only in the range of 75 μm, i.e. the thickness of the thermosetting adhesive film, from the copper pattern on the surface of the glass epoxy base material, and fluctuation of the plated film thickness at 2500 via-holes was equal to or less than ±1 μm.

As explained above, it was revealed that the thickness of the plated film in plural via-holes could be controlled uniformly by performing the plating while applying a potential to copper foil placed not on the surface, but at the midpoint of the via-hole.

(Embodiment 4)

Via-holes were formed using the similar substrate to that of the embodiment 2 by a similar method employed in the embodiment 2. After forming the via-holes, the substrate was immersed into the electroless plating solution for performing electroless copper plating initiated from the copper pattern on the surface of the glass epoxy substrate. A copper board having a surface area of 2000 $cm^2$ had been immersed previously into the plating solution for performing electroless copper plating onto the copper board. After immersing the substrate into the plating solution, a potential of +500 mv in comparison with the copper board of 2000 $cm^2$ was applied to the copper foil on the surface of the substrate, which had been used as a mask when forming the via-holes, using a potentiostat.

The total thickness of the thermosetting adhesive film and the polyimide film is approximately 100 μm. Since the plating rate of the electroless copper plating is approximately 3 μm/h, it takes approximately 33 hours for the plated copper film grown from the copper pattern on the surface of the glass epoxy base material to touch the copper foil on the surface. Therefore, the electroless copper plating was continued for 40 hours. As a result, it was found that the plating reaction at all the 2500 via-holes was stopped at the moment when the plated film touched the copper foil on the surface of the substrate, and fluctuation of the plated film thickness at 2500 via-holes was equal to or less than ±1 μm.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 5)

A substrate having via-holes, the insides of which were filled with plated metal, was manufactured by a similar method as the embodiment 2 except that the substrate C was used instead of the substrate B. As a result, it was found that the plating reaction at all the 2500 via-holes was stopped at the moment when the plated film touched the copper foil on the surface of the substrate, and fluctuation of the plated film thickness at 2500 via-holes was equal to or less than ±1 μm.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 6)

A substrate having via-holes was manufactured by a similar method as the embodiment 2 except that the substrate D was used instead of the substrate B. As a result, it was found that the plating reaction at all the 2500 via-holes was stopped at the moment when the plated film touched the copper foil on the surface of the substrate, and fluctuation of the plated film thickness at 2500 via-holes was equal to or less than ±1 μm.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 7)

A substrate having via-holes was manufactured by a similar method as the embodiment 2 except that the substrate E was used instead of the substrate B. Subsequently, the chromium layer of the upper most plane of the three-layered conductor at the bottom of the via-hole was removed by 18% hydrochloric acid aqueous solution to expose the copper foil, and the substrate was immersed into the electroless copper plating solution. Then, the plating was performed in the same manner as the embodiment 2 while applying a potential to the copper foil on the surface.

As a result, it was found that the plating reaction at all the 2500 via-holes was stopped at the moment when the plated film touched the copper foil on the surface of the substrate, and fluctuation of the plated film thickness at 2500 via-holes was equal to or less than ±1 μm.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 8)

A substrate having via-holes was manufactured by a similar method as the embodiment 2 except that the substrate F was used instead of the substrate B. Subsequently, the titanium layer of the upper most plane of the three-layered conductor at the bottom of the via-hole was removed by a 18% hydrochloric acid aqueous solution to expose the copper foil, and the substrate was immersed into the electroless copper plating solution. Then, the plating was performed in the same manner as the embodiment 2 while applying a potential to the copper foil on the surface.

As a result, it was found that the plating reaction at all the 2500 via-holes was stopped at the moment when the plated film touched the copper foil on the surface of the substrate, and fluctuation of the plated film thickness at 2500 via-holes was equal to or less than ±1 μm.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 9)

The via-holes in the substrate were filled with plated metal by a similar method as the embodiment 2 except that the substrate G was used instead of the substrate B. As a result, it was found that the plating reaction at all the 2500 via-holes was stopped at the moment when the plated film touched the copper foil on the surface of the substrate, and fluctuation of the plated film thickness at 2500 via-holes was equal to or less than ±1 μm.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 10)

The via-holes in the substrate were filled with plated metal by a similar method as the embodiment 2 except that the substrate I was used instead of the substrate B. As a result, it was found that the plating reaction at all the 2500 via-holes was stopped at the moment when the plated film touched the copper foil on the surface of the substrate, and fluctuation of the plated film thickness at 2500 via-holes was equal to or less than ±1 μm.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 11)

The via-holes in the substrate were filled with a plated metal by a similar method as the embodiment 2 except that the substrate J was used instead of the substrate B. As a result, it was found that the plating reaction at all the 2500 via-holes was stopped at the moment when the plated film touched the copper foil on the surface of the substrate, and fluctuation of the plated film thickness at 2500 via-holes was equal to or less than ±1 $\mu$m.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 12)

Polymide varnish was applied onto the surface of the substrate K of 5 inches in diameter by a spin coating method, and cured under a nitrogen atmosphere at 400° C. for one hour. Then, a titanium film 0.05 $\mu$m thick and a copper film 3 $\mu$m thick were formed successively by spattering. The thickness of the polyimide layer was 5 $\mu$m. A similar etching resist as the embodiment 2 was formed on the prepared copper foil, and the resist at only via-hole portions was removed by exposure and development. Then, patterning was performed on the titanium film and the copper film, and only the titanium and the copper at the via-hole portions were removed. Subsequently, via-holes were formed in the polyimide layer by dry etching. The dry etching was performed using a parallel board type dry etcher (made by Anelba Co.: DEA-506) with an output power of 800 W under an oxygen pressure of 3 Pa. The number of via-holes formed was 5000 holes, and the each hole was 10 $\mu$m in diameter.

Subsequently, electroless copper plating was performed using a similar method as the embodiments 2 or 3 while applying a potential to the copper on the surface of the polyimide layer. The plating time was two hours.

As a result, it was found that the plating reaction at all the 5000 via-holes was stopped at the moment when the plated film touched the copper foil on the surface of the substrate, and fluctuation of the plated film thickness at 5000 via-holes was equal to or less than ±0.2 $\mu$m.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 13)

The via-holes in the substrate were filled with plated metal by a similar method as the embodiment 12 except that the substrate L was used instead of the substrate K. As a result, it was found that the plating reaction at all the 5000 via-holes was stopped at the moment when the plated film touched the copper foil on the surface of the substrate, and fluctuation of the plated film thickness at 5000 via-holes was equal to or less than ±0.2 $\mu$m.

As explained above, it was revealed that the thickness of the plated film for filling plural via-holes could be controlled uniformly by performing the electroless plating while applying a potential to the copper foil on the surface of the substrate, which had been used as a mask when forming the via-holes.

(Embodiment 14)

The via-holes in the substrate were filled with plated metal by a similar method as the embodiment 12 except that the substrate M was used instead of the substrate K. As a result, it was found that the plating reaction at all the 5000 via-holes was stopped at the moment when the plated film touched the copper foil on the surface of the substrate, and fluctuation of the plated film thickness at 5000 via-holes was equal to or less than ±0.2 $\mu$m.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 15)

The substrate L was used, and a heat-oxidized film was used as the insulating film. A titanium film 0.1 $\mu$m thick and a copper film 3 $\mu$m thick were formed on the surface of the heat-oxidized film successively by spattering. The thickness of the heat-oxidized film was 5 $\mu$m. A similar etching resist as the embodiment 2 was formed on the prepared copper foil, and the resist at only the via-hole portions was removed by exposure and development. Then, patterning was performed on the titanium film and the copper film, and only the titanium and the copper at the via-hole portions were removed. Subsequently, 5000 via-holes were formed in the polyimide layer by milling. The size of each hole was 0.5 m in diameter.

Subsequently, electroless copper plating was performed by a similar method as the embodiments 2 or 3 while applying a potential to the copper on the surface of the heat-oxidized film. The plating time was one hour.

As a result, it was found that the plating reaction at all the 5000 via-holes was stopped at the moment when the plated film touched the copper foil on the surface of the substrate.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 16)

Via-holes were formed using the substrate H instead of the substrate B by a similar method as the embodiment 1. Then, the substrate was immersed into a electroless Ni—P plating solution for performing electroless nickel plating initiated from the nickel pattern on the surface of the glass substrate.

A nickel board having a surface area of 2000 cm$^2$ had been immersed previously into a plating solution for performing electroless Ni—P plating onto the nickel board. After immersing the substrate into the plating solution, a potential of +500 mV in comparison with the nickel board of 2000 cm$^2$ was applied to the copper foil on the surface of the substrate, Which had been used as a mask when forming the via-holes, using a potentiostat.

The total thickness of the thermosetting adhesive film and the polyimide film is approximately 100 $\mu$m. Since the plating rate of the electroless Ni—P plating is approximately 15 $\mu$m/h, it takes approximately 6.7 hours for the plated Ni—P film grown from the nickel pattern on the surface of the glass epoxy base material to touch the copper foil on the surface. Therefore, the electroless Ni—P plating was continued for 8 hours. As a result, it was found that the plating reaction at all the 2500 via-holes was stopped at the moment when the plated film touched the copper foil on the surface of the substrate, and fluctuation of the plated film thickness at 2500 via-holes was equal to or less than ±1 $\mu$m.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 17)

The substrate B 100 mm square was immersed into an alkaline aqueous solution containing dimethylamine borane by 10 g/liter for reducing the copper surface, which had been roughened previously by a chemical oxidation treatment. Subsequently, the substrate was immersed into the electroless cobalt plating solution to form cobalt onto the surface of the copper to 0.5 $\mu$m. Then, after forming via-holes by the similar method with the embodiment 2, the substrate was immersed into the electroless cobalt plating solution.

A cobalt plated iron board having a surface area of 2000 $cm^2$ had been immersed previously into the plating solution for performing electroless cobalt plating onto the cobalt plated iron board. After immersing the substrate into the plating solution, a potential of +500 mV in comparison with the cobalt plated iron board of 2000 $cm^2$ was applied to the copper foil on the surface of the substrate, which had been used as a mask when forming the via-holes, using a potentiostat.

The total thickness of the thermosetting adhesive film and the polyimide film is approximately 100 $\mu$m. Since the plating rate of the electroless cobalt plating is approximately 15 $\mu$m/h, it takes approximately 6.7 hours for the plated cobalt film grown from the cobalt plated copper pattern on the surface of the glass epoxy base material to touch the copper foil on the surface. Therefore, the electroless cobalt plating was continued for 8 hours. AS a result, it was found that the plating reaction at all the 2500 via-holes was stopped at the moment when the plated film touched the copper foil on the surface of the substrate, and fluctuation of the plated film thickness at 2500 via-holes was equal to or less than ±1 $\mu$m.

As explained above, it was revealed that the thickness of the plated film for filling plural via-holes could be controlled uniformly by performing electroless plating while applying a potential to the copper foil on the surface of the substrate, which had been used as a mask when forming the via-holes.

(Embodiment 18)

A polyimide film having a stainless steel alloy foil instead of a copper foil was adhered onto the substrate B by interposing a thermosetting adhesive film. The thickness of the stainless steel foil was 12 $\mu$m. After adhering the polyimide film having the stainless alloy foil onto the substrate B using the thermosetting adhesive film as in the embodiment 2, a photosensitive etching resist (made by Tokyo Ouka Co.: OFPR-800) was formed onto the surface of the stainless alloy foil, and subsequently, the resist at the portion where the via-holes should be formed was removed by conventional exposure and development. After patterning the stainless alloy foil by etching, the etching resist was removed using a conventional removing solution.

Then, the via-holes were manufactured. An excimer laser was used for the manufacturing. The surface of the substrate was irradiated by a laser beam 20 mm wide. The via-holes were manufactured by the so-called conformal masking method. That is, the stainless alloy foil on the surface of the substrate operated as a mask, and only the portions where the stainless alloy foil was patterned were manufactured. The formed via-holes were 100 $\mu$m in diameter, and a total of 2500 holes was provided with a 2 mm pitch.

After forming the via-holes, the substrate was immersed into the electroless copper plating solution for performing the electroless copper plating initiated from the copper pattern on the surface of the glass epoxy substrate. A copper board having a surface area of 2000 $cm^2$ had been immersed previously into the plating solution for performing the electroless copper plating onto the copper board. After immersing the substrate into the plating solution, a potential of +500 mV in comparison with the copper board of 2000 $cm^2$ was applied to the stainless alloy foil on the surface of the substrate, which had been used as a mask when forming the via-holes, using a potentiostat.

The total thickness of the thermosetting adhesive film and the polyimide film is approximately 100 $\mu$m. Since the plating rate of the electroless copper plating is approximately 3 $\mu$m/h, it takes approximately 33 hours for the plated copper film grown from the copper pattern on the surface of the glass epoxy base material to touch the copper foil on the surface. Therefore, the electroless copper plating was continued for 40 hours. As a result, it was found that the plating reaction at all the 2500 via-holes was stopped at the moment when the plated film touched the stainless alloy foil on the surface of the substrate, and fluctuation of the plated film thickness at 2500 via-holes was equal to or less than ±1 m.

As explained above, it was revealed that the thickness of the plated film for filling plural via-holes could be controlled uniformly by performing electroless plating while applying a potential to the stainless alloy foil on the surface of the substrate, which had been used as a mask when forming the via-holes.

(Embodiment 19)

A polyimide film having no metal foil was adhered onto the substrate B by interposing a thermosetting adhesive film. After adhering the polyimide film onto the substrate B using the thermosetting adhesive film, an aluminum film or a tungsten film 1 $\mu$m thick was formed onto the polyimide film by spattering. Then, a photosensitive etching resist (made by Tokyo Ouka Co.: OFPR-800)was formed onto the surface of the aluminum film or the tungsten film, and subsequently, the resist at the portion where the via-holes should be formed was removed by conventional exposure and development. After patterning the aluminum film or the tungsten film by etching, the etching resist was removed using a conventional removing solution.

Then, the via-holes were manufactured. An excimer laser was used for the manufacturing. The surface of the substrate was irradiated by a laser beam 20 mm wide. The via-holes were manufactured by the so-called conformal masking method. That is, the aluminum film or the tungsten film on the surface of the substrate operated as a mask, and only the portions where the aluminum film or the tungsten film was patterned were manufactured. The formed via-holes were 100 $\mu$m in diameter, and a total of 2500 holes were formed with a 2 mm pitch.

After forming the via-holes, the substrate was immersed into the electroless copper plating solution for performing electroless copper plating initiated from the copper pattern on the surface of the glass epoxy substrate. A copper board having a surface area of 2000 $cm^2$ had been immersed previously into the plating solution for performing the electroless copper plating onto the copper board. After immersing the substrate into the plating solution, a potential of +500 mV in comparison with the copper board of 2000 $cm^2$ was applied to the aluminum film or the tungsten film on the surface of the substrate, which had been used as a mask when forming the via-holes, using a potentiostat.

The total thickness of the thermosetting adhesive film and the polyimide film is approximately 100 $\mu$m. Since the plating rate of the electroless copper plating is approximately 3 μm/h, it takes approximately 33 hours for the plated copper film grown from the copper pattern on the surface of the glass epoxy base material to touch the copper foil on the surface. Therefore, the electroless copper plating was continued for 40 hours. As a result, it was found that the plating reaction at all the 2500 via-holes was stopped at the moment when the plated film touched the aluminum film or the tungsten film on the surface of the substrate, and fluctuation of the plated film thickness at 2500 via-holes was equal to or less than ±1 μm.

As explained above, it was revealed that the thickness of the plated film for filling plural via-holes could be controlled uniformly by performing electroless plating while applying a potential to the aluminum film or the tungsten film on the surface of the substrate, which had been used as a mask when forming the via-holes.

(Embodiment 20)

The substrate, in which via-holes had been filled with electroless copper plating in the embodiment 2, was used. The substrate was immersed into a 10% sulfuric acid aqueous solution for 2 minutes for cleaning the surface. After adhering a cellophane tape to the rear side of the substrate for protection, the substrate was immersed into an acidic aqueous solution containing palladium colloid of an electroless plating catalyst with a sensitizer (made by Hitachi Chemical Co.: HS101B) for 5 minutes, washed with water, treated with a treating solution made of mainly hydrochloric acid for promoting the reaction for 5 minutes, and washed with water, sequentially, Then, the cellophane tape on the rear side was peeled off, and electroless copper plating was performed. The plating time was 10 hours, and the thickness of the plated copper layer was approximately 30 μm. As a result, a dent approximately 7 μm deep remained at the via-hole portion after the plating, and the via-hole portion could be identified by observation using a microscope.

In accordance with the present embodiment, it was revealed that one of the objects of the present invention, which is to provide a circuit board in which a via-hole portion could be identified from the surface of the substrate after forming a next conducting layer, in order to manufacture a multilayered circuit board using the substrate, in which via-holes were filled with plated metal, could readily be achieved.

(Embodiment 21)

The substrate, in which via-holes had been filled with electroless copper plating in the embodiment 19, was used. After filling the via-holes by electroless copper plating, the substrate was immersed into a 17% hydrochloric acid aqueous solution for removing tungsten by etching. Then, the substrate was immersed into a 10% sulfuric acid aqueous solution for 2 minutes for clearing the surface. After adhering a cellophane tape to the rear side of the substrate for protection, the substrate was immersed into an acidic aqueous solution containing palladium colloid of an electroless plating catalyst with a sensitizer (made by Hitachi Chemical Co.: HS101B) for 5 minutes, washed with water, treated with a treating solution made of mainly hydrochloric acid for promoting the reaction for 5 minutes, and again washed with water. Then, the cellophane tape on the rear side was peeled off, and electroless copper plating was performed. The plating time was 5 hours, and the thickness of the plated copper layer was approximately 15 μm. As the result, it was confirmed by use of a microscope observation that the surface of the copper plated onto the via-hole portion was rougher than the surface of the copper plated onto the polyimide film. Accordingly, it was revealed that the via-hole portion could be identified using a microscope even after plating.

In accordance with the present embodiment, it was revealed that one of the objects of the present invention, which is to provide a circuit board in which a via-hole portion could be identified from the surface of the substrate after forming a next conducting layer, in order to manufacture a multilayered circuit board using the substrate, in which via-holes were filled with plated metal, could readily be achieved.

(Embodiment 22)

The substrate, in which via-holes had been filled with electroless copper plating in the embodiment 19, was used. After filling the via-holes by electroless copper plating, the substrate was immersed into a 17% hydrochloric acid aqueous solution for removing tungsten by etching. Then, the substrate was immersed into a 10% sulfuric acid aqueous solution for 2 minutes for clearing the surface. After washing with water, the substrate was dried in a vacuum dryer at 120° C. for one hour. After the drying, a three layered conductor of chromium/copper/chromium 0.05/10/0.05 μm in thickness was formed onto the surface of the substrate by spattering. As a result, it was confirmed by observation using a microscope that the surface of the three layered conductor formed onto the via-hole portion was rougher than the surface of the three layered conductor formed onto the polyimide film. Accordingly, it was revealed that the via-hole portion could be identified using a microscope even after forming the conductor by spattering.

In accordance with the present embodiment, it was revealed that one of the objects of the present invention, which is to provide a circuit board in which a via-hole portion could be identified from the surface of the substrate after forming a next conducting layer, in order to manufacture a multilayered circuit board using the substrate, in which via-holes were filled with plated metal, could readily be achieved.

In order to evaluate the present invention, cases in which the present invention is not applied are indicated hereinafter as comparative examples.

(Comparative Example 1)

The via-holes were formed in the same manner as the embodiment 2. Then, the substrate was immersed into an electroless plating solution. At that time, no potential was applied to the copper foil on the surface of the substrate. The electroless plating reaction proceeded from the copper pattern on the surface of the glass epoxy substrate at the bottom of the via-hole. Concurrently, the electroless copper plating reaction proceeded on the copper foil on the surface of the substrate. As a result, the via-hole was closed before being filled with the plated metal precipitated from the bottom of the via-hole. Accordingly, a void remained in the via-hole portion after plating, and the via-holes could not be completely filled with the metal.

(Comparative Example 2)

The via-holes were formed in the same manner as the embodiment 19. After forming the via-holes, only the aluminum film on the surface of the substrate was removed by etching using a 17% hydrochloric acid aqueous solution. Then, the substrate was immersed into an electroless copper plating solution. The electroless copper plating proceeded from the copper pattern on the surface of the glass epoxy substrate.

The total thickness of the thermosetting adhesive film and the polyimide film was approximately 100 μm. Since the plating rate of electroless copper plating is approximately 3 μm/h, it takes approximately 33.3 hours for the plated copper film grown from the copper pattern on the surface of the glass epoxy base material to reach the surface of the polyimide film. Therefore, the electroless copper plating was continued for 33.3 hours.

As a result, it was found that at least 10% of the 2500 via-holes had dents equal to or larger than 5 µm. The fluctuation of the plated film thickness at 2500 via-holes viewed from the polyimide surface was equal to or larger than ±8 µm.

As explained above, it was revealed that the thickness of the plated film could not be controlled reproducibly.

(Embodiment C)

A practical example of application of the thin film multilayered board manufactured in accordance with the previous embodiments A and B will be is explained hereinafter.

Figure 10:
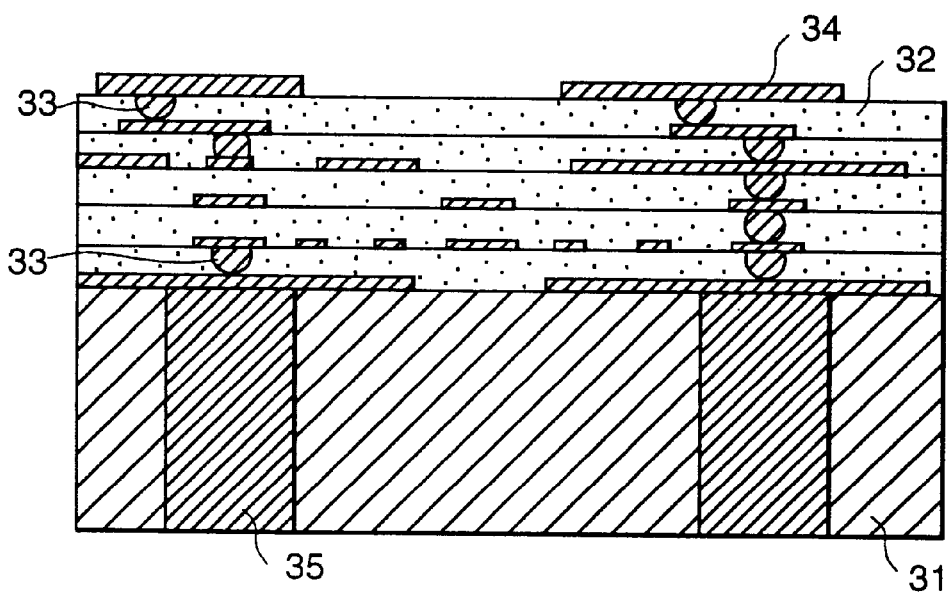
FIG. 10 is a schematic cross section of the thin film multilayered substrate including via-stud connection according to the present invention.
Figure 12:
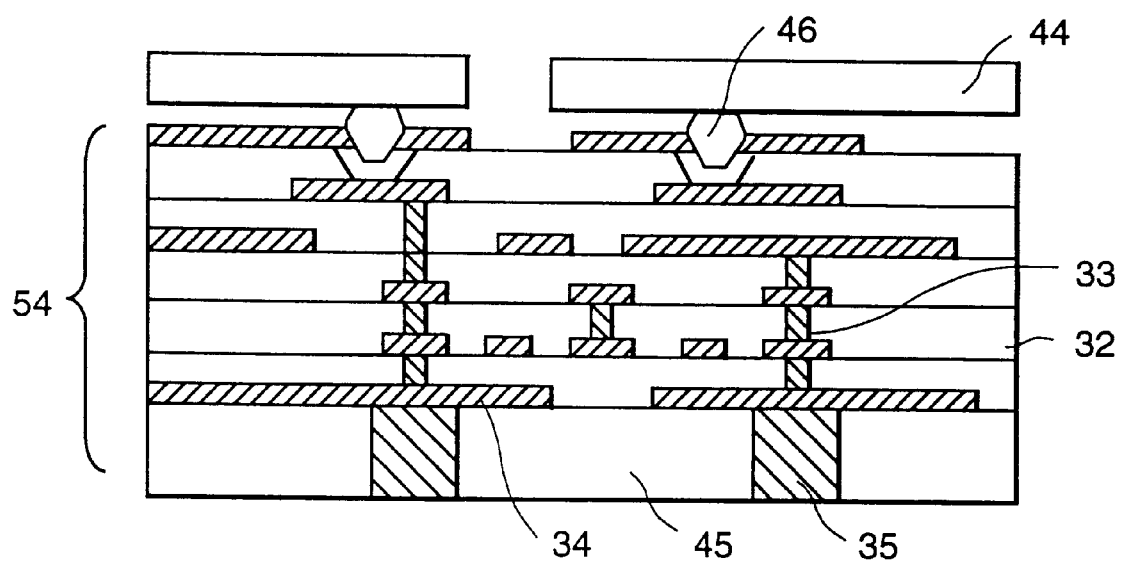
FIG. 12 is a schematic cross section of a mounted substrate using the thin film multilayered circuit substrate according to the present invention.

An example of the via-stud type thin film multilayered substrate of the present invention is illustrated as a schematic cross section in FIG. 10. An insulating layer (for example polyimide and the like) 32 is formed on a substrate 31 composed of ceramics or glass epoxy. Via-holes are formed in the insulating layer 32, and a plurality of the insulating layers 32 are laminated with connecting interlayer metal conductor layers 34 by the via-stud 33 composed of filled bodies of conductive electroless plated metal. The thin film multilayered circuit board is formed by laminating a plurality of the metallic circuit layers and by connecting them with a via-stud 33, sequentially.

Figure 11:
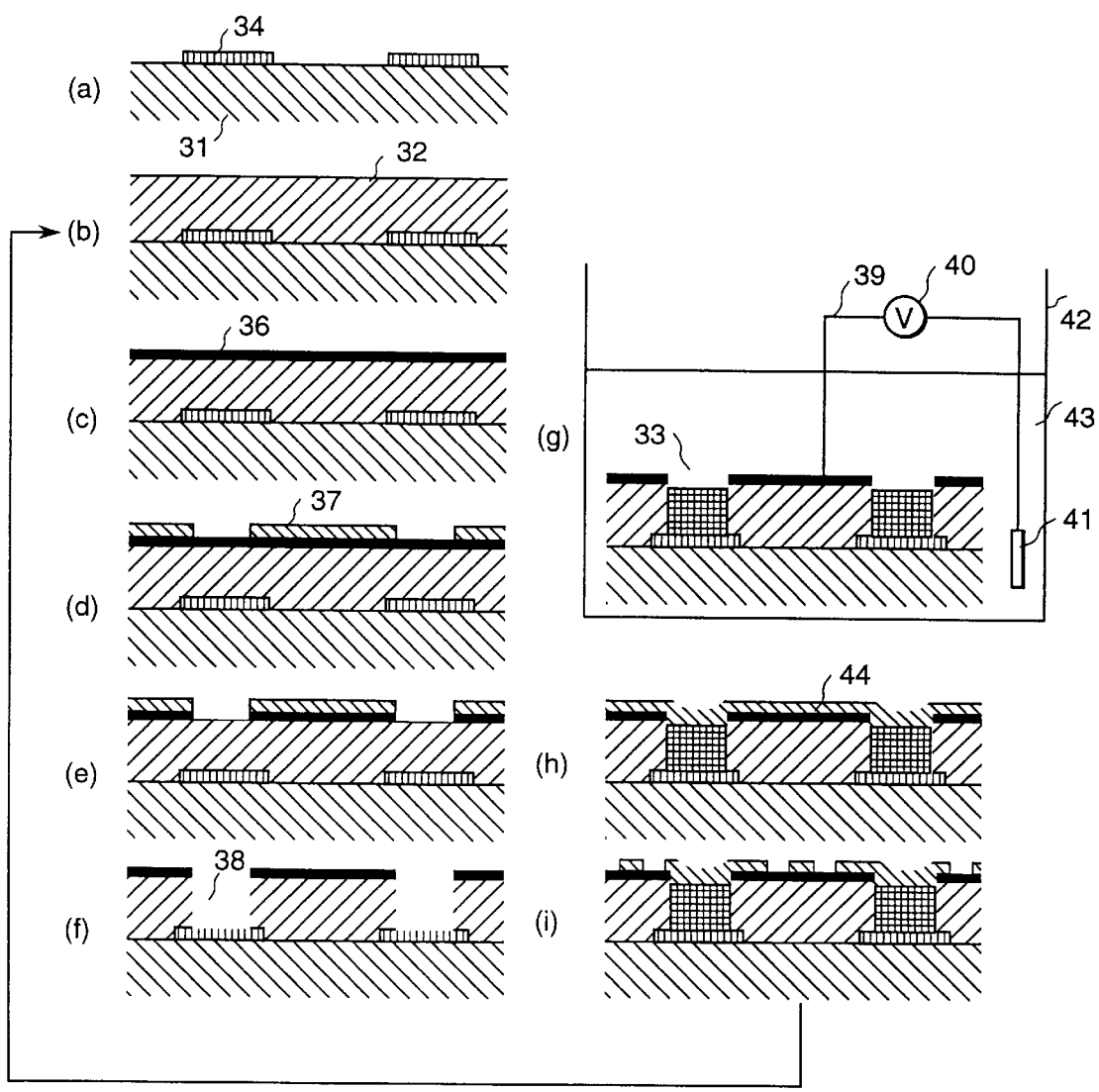
FIG. 11 is a flow diagram formed of schematic cross sections indicating an example of a manufacturing process flow of the thin film two layered circuit substrate of a via-stud connecting type according to the present invention, or forming an insulating layer and a conductor on the substrate.
Figure 13:
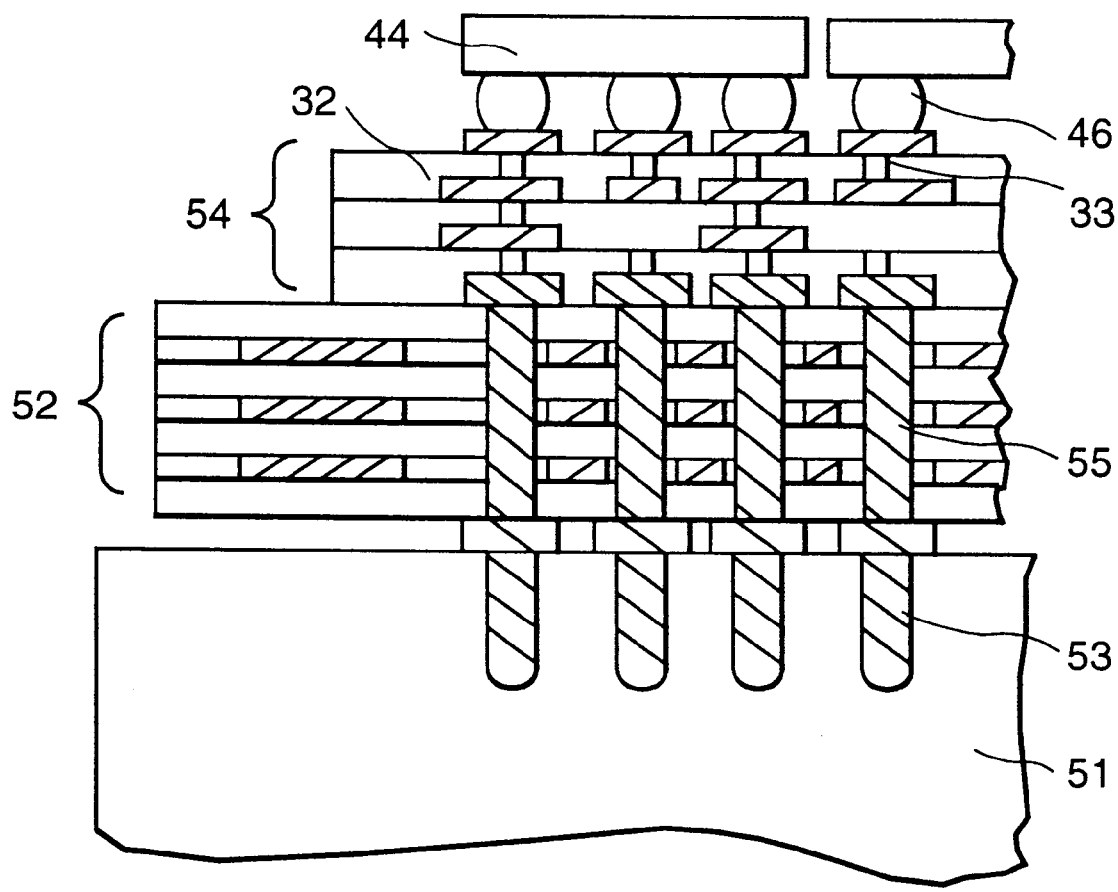
FIG. 13 is a schematic cross section indicating an example of the mounting of a substrate for a large scale computer according to the present invention.

FIG. 11 is a flow diagram indicating an example of a method of manufacturing a thin film multilayered substrate with schematic cross sections. The insulating layer 32 is formed on the substrate 31 having a metallic circuit layer 34. The conductor 36 is provided by forming a chromium layer 0.05 µm thick on the insulating layer 32 by a spattering method, and then, forming a copper layer 3 µm thick thereon. The resist 37 is formed on the surface of the copper layer, and a desired pattern is formed by steps of exposure and development. The conductor 36 composed of copper and chromium is etched, and the resist 37 is removed. Using the patterned conductor 36 as a mask, via holes 38 are formed by dry etching. The etching was performed using oxygen plasma under a condition of a low gas pressure, such as a pressure equal to or lower than 5 Pa. After forming the via-holes 38, the substrate was immersed into the electroless copper plating solution 43 in the plating vessel 42 to perform electroless copper plating

What is claimed is:

1. A method of manufacturing a circuit board including a first conductor, a second conductor, an insulating layer formed between said first conductor and said second conductor, the second conductor being spaced from the first conductor by the insulating layer so as to be electrically insulated from the first conductor, and a third conductor formed in said insulating layer in order to electrically connect said first conductor and said second conductor, comprising the steps of:

performing electroless plating by an electroless plating reaction, to form the third conductor to connect the first conductor and the second conductor; and while performing electroless plating, applying a potential, higher than a potential of the electroless plating reaction during the electroless plating, to said second conductor from an external power source.

2. The method of manufacturing a circuit board according to claim 1, further comprising the steps of:

forming said first conductor onto an insulating substrate;

forming said insulating layer onto said first conductor and said insulating substrate;

forming material for said second conductor on said insulating layer;

performing a patterning of said material for said second conductor, to form said second conductor; and forming via-holes through the insulating layer, wherein said forming via-holes includes performing a laser or plasma processing using said second conductor as a mask.

3. The method of manufacturing a circuit board according to claim 1, further comprising the steps of:

forming said first conductor onto an insulating substrate;

laminating an insulating film having material for said second conductor on its surface onto said first conductor and said insulating substrate;

performing a patterning of said material for said second conductor, to form said second conductor; and forming via-holes through the insulating layer, wherein said forming via-holes includes a step of performing a laser or plasma processing using said second conductor as a mask.

4. The method of manufacturing a circuit board according to claim 1, including the further step of forming via-holes through said insulating layer; and wherein, during the electroless plating, the circuit board is immersed in an electroless plating solution.

5. The method of manufacturing a circuit board according to claim 1, including the further step of forming via-holes, exposing the first conductor, in the insulating layer, and wherein the electroless plating is performed to form the third conductor in the via-holes.

6. The method of manufacturing a circuit board according to claim 1, wherein the potential higher than the potential of the electroless plating reaction is applied to the second conductor such that when the third conductor contacts the second conductor during the electroless plating, electroless plating of the third conductor at the second conductor stops.

7. The method of manufacturing a circuit board according to claim 1, wherein said potential applied to the second conductor is in a range of +0.1 to +1.5 V in comparison with the potential of the electroless plating reaction.

8. The method of manufacturing a circuit board according to claim 1, wherein said potential applied to the second conductor is in a range of +0.4 to +0.7 V in comparison with the potential of the electroless plating reaction.

9. The method of manufacturing a circuit board according to claim 1, wherein said third conductor is made of a material selected from the group consisting of copper, nickel, silver, gold, palladium, solder and cobalt.

10. The method of manufacturing a circuit board according to claim 1, further comprising a step of covering exposed surfaces of said second conductor and said third conductor with a fourth conductor.

11. The method of manufacturing a circuit board according to claim 1, wherein in said performing electroless plating, the electroless plating originates from the first conductor, electrically insulated from the second conductor.

12. A method of electroless plating for depositing an electrolessly plated conductor on a surface of a first conductor, comprising the steps of:

providing said first conductor and a second conductor, which is electrically insulated from said first conductor, overlying a surface of a body which is going to be plated;

performing electroless plating to deposit said electrolessly plated conductor, by an electroless plating reaction; and applying a potential higher than-the potential of said electroless plating reaction to said second conductor during said electroless plating, said potential being applied from an external power source.

13. The method of electroless plating according to claim 12, wherein said second conductor is provided at a position separated from the surface of the body, in electroless plating solution used for the electroless plating.

14. The method of electroless plating according to claim 12, wherein said potential to be applied to said second conductor is in a range of +0.1 to +1.5 V in comparison with the potential of the electroless plating reaction.

15. The method of electroless plating according to claim 12, wherein said potential to be applied to said second conductor is in a range of +0.4 to +0.7 V in comparison with the potential of the electroless plating reaction.

16. The method of electroless plating according to claim 12, wherein said second conductor and said first conductor are separated by an insulating layer.

17. The method of electroless plating according to claim 12, wherein the first conductor and the second conductor are separated by an insulating layer, said insulating layer has a groove therethrough exposing the first conductor, and wherein the electrolessly plated conductor is deposited in the groove.

18. Thee method of electroless plating according to claim 12, wherein the first conductor and the second conductor are separated by an insulating layer, said insulating layer has a hole exposing the first conductor, and wherein the electrolessly plated conductor is deposited in the hole.

19. The method of electroless plating according to claim 12, wherein the potential higher than the potential of the electroless plating reaction is applied to the second conductor such that when the electrolessly plated conductor contacts the second conductor during the electroless plating, electroless plating of the electrolessly plated conductor at the second conductor stops.

20. The method of electroless plating according to claim 12, wherein the first conductor is insulated from the second, conductor by an insulating layer, the insulating layer having a surface furthest from the first conductor, and wherein the second conductor is positioned between the first conductor and said surface of the insulating layer.

21. The method of electroless plating according to claim 12, wherein the first conductor is insulated from the second conductor by an insulating layer, the insulating layer having at least two holes extending into the insulating layer from a surface thereof, two of the holes extending into the insulating layer to different depths and each exposing a portion of the first conductor which respectively is at a different depth from the surface.

22. The method of electroless plating according to claim 12, wherein in said performing electroless plating, the electrolessly plated conductor is deposited originating from the first conductor, electrically insulated from the second conductor.

* * * * *